(12) United States Patent
Khlat et al.

(10) Patent No.: US 12,549,137 B2
(45) Date of Patent: Feb. 10, 2026

(54) PA COARSE COMPLEX VSWR DETECTION (QUADRANT) FOR ANALOG-ASSISTED DPD AND PA LOAD MODULATION OPTIMIZATION

(71) Applicant: Qorvo US, Inc., Greensboro, NC (US)

(72) Inventors: Nadim Khlat, Cugnaux (FR); Baker Scott, San Jose, CA (US); Kevin Wesley Kobayashi, Redondo Beach, CA (US); George Maxim, Saratoga, CA (US)

(73) Assignee: Qorvo US, Inc., Greensboro, NC (US)

( * ) Notice: Subject to any disclaimer, the term of this patent is extended or adjusted under 35 U.S.C. 154(b) by 433 days.

(21) Appl. No.: 18/334,435

(22) Filed: Jun. 14, 2023

(65) Prior Publication Data
US 2023/0421111 A1    Dec. 28, 2023

Related U.S. Application Data

(60) Provisional application No. 63/356,250, filed on Jun. 28, 2022.

(51) Int. Cl.
| | |
|---|---|
| H03F 1/32 | (2006.01) |
| H03F 1/56 | (2006.01) |
| H03F 3/189 | (2006.01) |
| H03F 3/20 | (2006.01) |

(52) U.S. Cl.
CPC ........... *H03F 1/3241* (2013.01); *H03F 1/565* (2013.01); *H03F 3/189* (2013.01); *H03F 3/20* (2013.01); *H03F 2200/387* (2013.01); *H03F 2200/435* (2013.01); *H03F 2200/451* (2013.01)

(58) Field of Classification Search
CPC ....................................................... H03F 1/3241
USPC .......................................................... 330/149
See application file for complete search history.

(56) References Cited

U.S. PATENT DOCUMENTS

| | | |
|---|---|---|
| 8,779,856 B2 | 7/2014 | Wilson et al. |
| 10,491,176 B1 | 11/2019 | Hur et al. |
| 11,121,731 B2 | 9/2021 | Ravi et al. |
| 11,303,251 B2 | 4/2022 | Wu et al. |

FOREIGN PATENT DOCUMENTS

| | | |
|---|---|---|
| EP | 2262105 A2 | 12/2010 |
| JP | 5089469 B2 | 12/2012 |

*Primary Examiner* — Henry Choe
(74) *Attorney, Agent, or Firm* — Withrow & Terranova, P.L.L.C.

(57) ABSTRACT

The present disclosure pertains to a power amplifier system that promotes enhanced signal linearity and overall system efficiency. The system includes a power amplifier with an amplification path for a radio frequency (RF) signal, and detector circuitry operationally linked to sample locations along this path. The detector circuitry captures and transmits signal characteristics of the RF signal. A voltage standing wave ratio (VSWR) quadrant data generator in communication with the detector circuitry generates VSWR quadrant data based on the detected signal characteristics. The baseband circuitry, comprised of a memory unit preconfigured with digital pre-distortion (DPD) coefficients and a DPD processor, controls the shaping of pre-distortion applied to the RF signal based on the VSWR data, thereby enhancing signal linearity. The components of the system interconnect and collaboratively function to optimize the performance and efficiency of the power amplifier system.

36 Claims, 6 Drawing Sheets

PA COARSE COMPLEX VSWR DETECTION (QUADRANT) FOR ANALOG-ASSISTED DPD AND PA LOAD MODULATION OPTIMIZATION

RELATED APPLICATIONS

This application claims the benefit of provisional patent application Ser. No. 63/356,250, filed Jun. 28, 2022, the disclosure of which is hereby incorporated herein by reference in its entirety.

FIELD OF THE DISCLOSURE

The present disclosure relates to power amplifiers and in particular to power amplifiers and supporting circuitry configured to increase the linearity thereof.

BACKGROUND

Traditional baseband digital pre-distortion (DPD) linearized power amplifiers use a single DPD coefficient set for different power amplifier load voltage standing wave ratio (VSWR) values. In most cases, the baseband has no knowledge of the load VSWR at the power amplifier output. Even if the system is configured to provide antenna VSWR measurements, the VSWR at antenna may be very different from the VSWR at the power amplifier output. Thus, antenna VSWR measurements may not be reliable for power amplifier linearization. As such, a need remains for a linearization structure and method that provide power amplifier linearization employing VSWR measurements.

SUMMARY

The present disclosure relates to a power amplifier system that is configured to enhance radio frequency (RF) signal linearity. The system includes a power amplifier with an amplification path from an RF input to an RF output. The power amplifier system also includes detector circuitry, which is coupled to sample locations within the amplification path. The detector circuitry is configured to detect the RF signal's characteristics at the sample locations and provide this information at detector outputs.

Additionally, the power amplifier system has a voltage standing wave ratio (VSWR) quadrant data generator. The VSWR quadrant data generator is in communication with the detector outputs and generates VSWR quadrant data in response to the detected signal characteristics. The determined VSWR quadrant data are then provided at a data output. The VSWR quadrant data provide an indication of the quadrant on a Smith Chart in which a present VSWR is located.

The power amplifier system also includes baseband circuitry. Within this baseband circuitry is a memory configured with digital pre-distortion (DPD) coefficients and a DPD processor. The DPD processor is communicatively coupled to the data output of the VSWR quadrant data generator. Based on the generated VSWR quadrant data, the DPD processor selectively retrieves appropriate DPD coefficients for the present VSWR location and the selected DPD coefficients to control the shaping of the pre-distortion applied to the RF signal, thereby enhancing the linear operation of the power amplifier and thus increasing the linearity of the signal.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description, serve to explain the principles of the disclosure.

DETAILED DESCRIPTION

Figure 1:
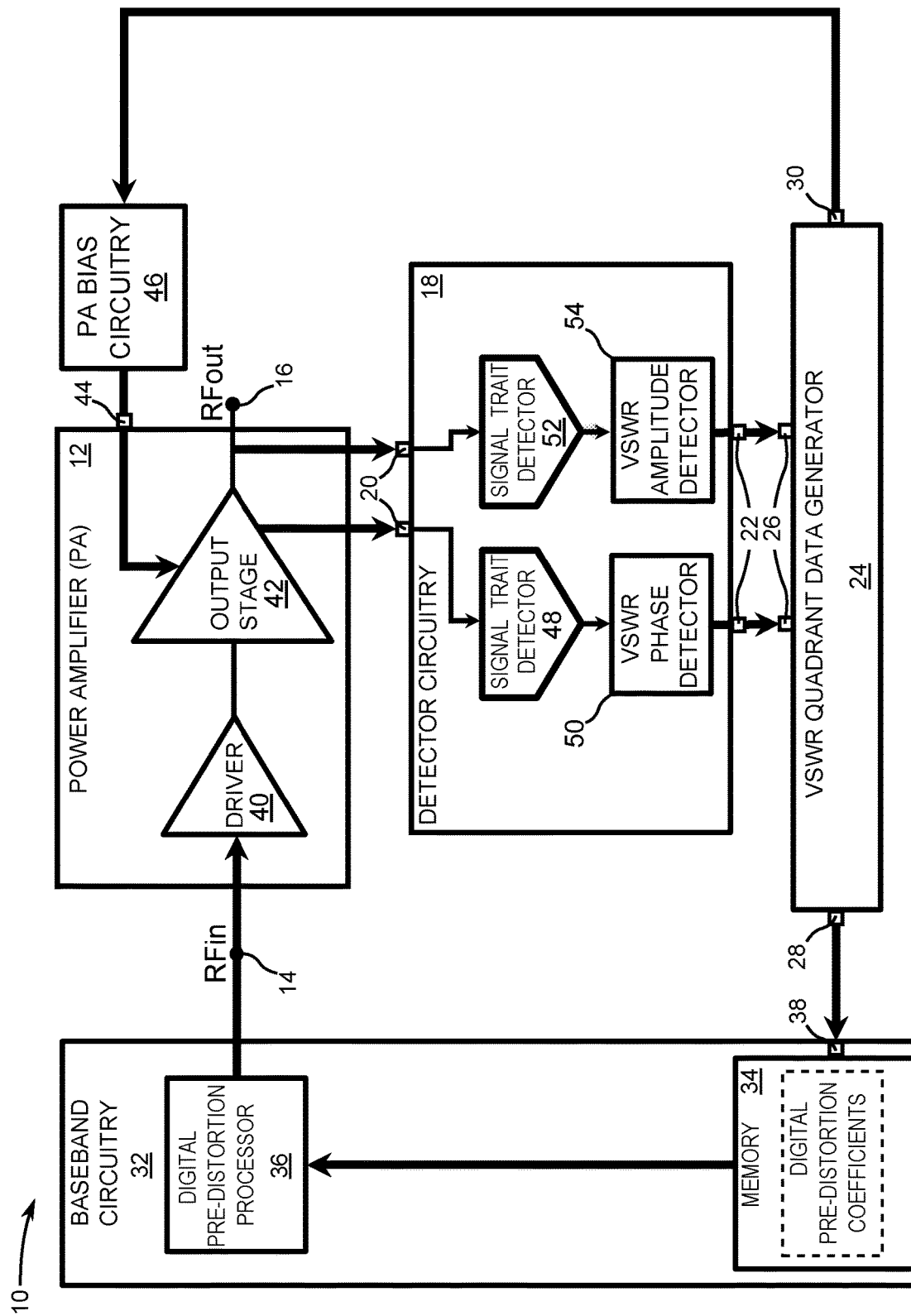
FIG. 1 is a diagram showing the principle of voltage standing wave ratio (VSWR) coarse quadrant detection that either may be used to assist the baseband digital pre-distortion (DPD) linearization or used locally in the front-end to improve transmit performance by way of load impedance modulation.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Digital pre-distortion (DPD) is used in prime-tier phones and offers good linearity performance at the price of an increased complexity and a more complicated system calibration. Power dissipation in the baseband for implementing DPD is continuously coming down with the scaling down of the complementary metal oxide semiconductor (CMOS) process to deep nanometer scale features from 45 nm to 22 nm, or 14 nm, and recently 7 nm, 5 nm, and 3 nm.

The power amplifier linearity is substantially affected by the load voltage standing wave ratio (VSWR). However, a baseband processor has no knowledge of the VSWR at the power amplifier output, which may be a collector of a power transistor in an output stage of the power amplifier. Some systems may have a VSWR detector at a transmit antenna, but a VSWR measurement at the antenna is not indicative of the VSWR at power amplifier output and may not be useful for improving power amplifier linearity based on VSWR measurements.

Both amplitude modulation—amplitude modulation (AM-AM) and amplitude modulation—phase modulation (AM-PM) have substantial changes over the load VSWR phase and amplitude. Knowing even in coarse terms where the load VSWR is, is usable to provide substantial transmit path linearity improvement.

Original equipment manufacturers increasingly require improved radio frequency linearity performance into moderate VSWR to 3:1 or higher.

A power amplifier can be characterized over VSWR phase and/or amplitude, but this is not sufficient since the baseband processor needs a way to know when a DPD coefficient set associated with the operation of the power amplifier should be updated. Using a single DPD coefficient set for all load VSWR values typically results in unacceptably higher levels of distortion in some operation bands and output power regions.

A solution to this issue that is in accordance with the present disclosure is to have a power amplifier output VSWR phase and/or amplitude detector and a VSWR quadrant data generator that discriminates or computes the VSWR quadrant of operation and sends an alert signal to the baseband processor. In some embodiments, only the VSWR phase quadrant is detected, while in some other embodiments, both phase and amplitude are coarsely detected.

Implementing a higher-accuracy VSWR detector within the scope of the present disclosure, is generally not necessary because using a higher-accuracy VSWR detector increases power consumption, while the DPD is not able to substantially increase the number of coefficient sets to offer a practical advantage.

The present disclosure relates to a power amplifier system that includes an analog-assisted digital pre-distortion (DPD) circuitry and method in which an analog front-end has detectors that are configured to perform relatively coarse VSWR measurement at a power amplifier output. In a first exemplary embodiment, a relatively coarse measurement of the VSWR phase can be implemented. In a more general case, both VSWR phase and VSWR amplitude can be coarsely measured, resulting in a relatively coarse complex VSWR detector. If the VSWR phase has only two sub-ranges and the VSWR amplitude has two sub-ranges, a four-region VSWR detection is implemented. In other embodiments, the VSWR phase can be discriminated into four sub-ranges, resulting in quadrant detection. The present disclosure relates to obtaining the relatively coarse measurement of the load VSWR using a voltage detector and a current detector, followed by a phase detection between the voltage and the current for VSWR phase coarse measurement and a voltage-to-current ratio computation for the VSWR amplitude coarse measurement. Additional detectors may be implemented in the front-end to assist with the coarse VSWR measurement. A power amplifier input power detector and/or a power amplifier output power detector may be added to the disclosed analog-assisted DPD circuitry. The DPD linearization is used at moderately high to peak power levels. At low and medium power, the DPD may be disabled. All the analog detectors consume current, which is acceptable when power amplifier operates at high power levels, but substantial current consumption by the detectors may be detrimental to the power amplifier efficiency at medium and low power levels. An enable signal for the entire analog-assisted DPD circuitry may be generated by using a detector placed at an isolation port of an antenna coupler. The detector is configured to measure reflected power level. A high reflected power compared with a given threshold is then employable to determine if the power amplifier operates at both high power level and high VSWR level.

In this regard, the present disclosure relates to a hybrid DPD—analog pre-distortion (APD) method and apparatus that provide analog assistance to the baseband DPD linearization by employing analog detectors in the front-end module that are employed to discriminate the approximate region of the load VSWR, which in turn is used by the baseband processor to select an appropriate DPD coefficient set.

The disclosed hybrid DPD-APD method and apparatus substantially reduce the size of the memory needed to store the DPD coefficient sets and may substantially reduce the complexity of a calibration process.

In many cases a given DPD deployed in the baseband chipset needs to operate with various power amplifiers, often coming from different vendors and having different characteristics.

The baseband DPD needs a thorough characterization of each power amplifier that is used and the calibration of the DPD coefficients for each mode of operation. Also, the DPD coefficients will be dependent on the band of operation or even the sub-band. All such information is available in the baseband.

For example,
- In a first phase range, both AM-AM and AM-PM have substantial distortion and both need to be corrected. This requires a special DPD coefficient set.
- In a second phase range, the power amplifier distortion is dominated by the AM-AM, while the AM-PM is relatively good. This requires yet another DPD coefficient set. If using the first coefficient set, phase distortion is created via overcompensation/pre-distortion.
- In a third phase range, the power amplifier distortion is dominated by the AM-PM, while the AM-AM is relatively good. This requires yet another DPD coefficient set. If using the first or second coefficient sets, amplitude distortion is created via overcompensation/pre-distortion.
- In the fourth phase range, both AM-AM and AM-PM are acceptable and no DPD, or a relatively smaller amount of DPD, is needed. Any of the prior three sets of DPD coefficients will result in power amplifier distortion.

Such characteristics may depend on the band of operation or even on the sub-band (particularly for the ultra-high-band operation: B77, B78, and B79). Different DPD coefficient sets need to be used.

As mentioned previously, the load VSWR matters much for the power amplifier distortion and linearization. In some cases the VSWR phase is more important. In such a case, it is sufficient to have even a coarse VSWR phase range knowledge to assist the DPD linearization. In other cases, both VSWR phase and VSWR amplitude matter. A complex VSWR quadrant or region needs to be estimated to help the DPD linearization.

FIG. 1 shows the general principle of the analog-assisted DPD using a coarse VSWR detection. One example of coarse detection is the VSWR quadrant, but other types of regional VSWR detection may be used.

The exemplary embodiment depicted in FIG. 1 is a power amplifier system 10 that includes a power amplifier 12 having an amplification path that is between a radio frequency (RF) input 14 and an RF output 16. The power amplifier system 10 also includes detector circuitry 18 having detector inputs 20 coupled to sample locations within the amplification path and detector outputs 22 from which detected RF signal characteristics are provided to a voltage standing wave ratio (VSWR) quadrant data generator 24 that has generator inputs 26 that are in communication with the detector outputs 22. The VSWR quadrant data generator 24 is configured to receive the detected signal characteristics and generate the VSWR quadrant data that indicate a present VSWR quadrant location. The VSWR quadrant data generator 24 further includes a first data output 28 and a second data output 30 through which the VSWR quadrant data are provided for further processing. The VSWR quadrant data generator 24 may include analog-to-digital converters (not shown) that are configured to convert analog signals received from the detector circuitry 18 into digital signals that include the VSWR quadrant data. The system further includes baseband circuitry 32 comprising a memory 34 that is configured with digital pre-distortion (DPD) coefficients. A DPD processor 36 has a first data input 38 that is coupled to the first data output 28 of the VSWR quadrant data generator 24.

In the exemplary embodiment of FIG. 1, the power amplifier 12 is made up of a driver 40 and an output stage 42, which has a bias input 44. Power amplifier (PA) bias circuitry 46 is coupled between second data output 30 and the bias input 44. During operation, the PA bias circuitry 46 is configured to respond to the VSWR quadrant data transmitted from the second data output 30 to adjust a bias of the output stage 42 to further increase linearity and efficiency of the output stage 42.

The power amplifier 12 is integrated into a front-end that has one or more detectors that are used to estimate the VSWR phase and/or VSWR amplitude. In the exemplary embodiment of FIG. 1, a first signal trait detector 48, which may be a current (I) detector, receives a signal from a first location in the amplifier path that includes the output stage 42. A VSWR phase detector 50 is configured to estimate VSWR phase from a trait detected by the first signal trait detector 48. A second signal trait detector 52, which may be a voltage (V) detector, receives a signal from a second location in the amplifier path that includes the output stage 42. A VSWR amplitude detector 54 is configured to estimate VSWR amplitude from a trait detected by the second signal trait detector 52. The power amplifier VSWR region discrimination made by the VSWR quadrant data generator 24 results in the VSWR quadrant data that are transmitted to the baseband circuitry 32 to update and/or select a DPD coefficient set to adjust the digital pre-distortion provided to the RF signal by the DPD processor 36.

Figure 2:
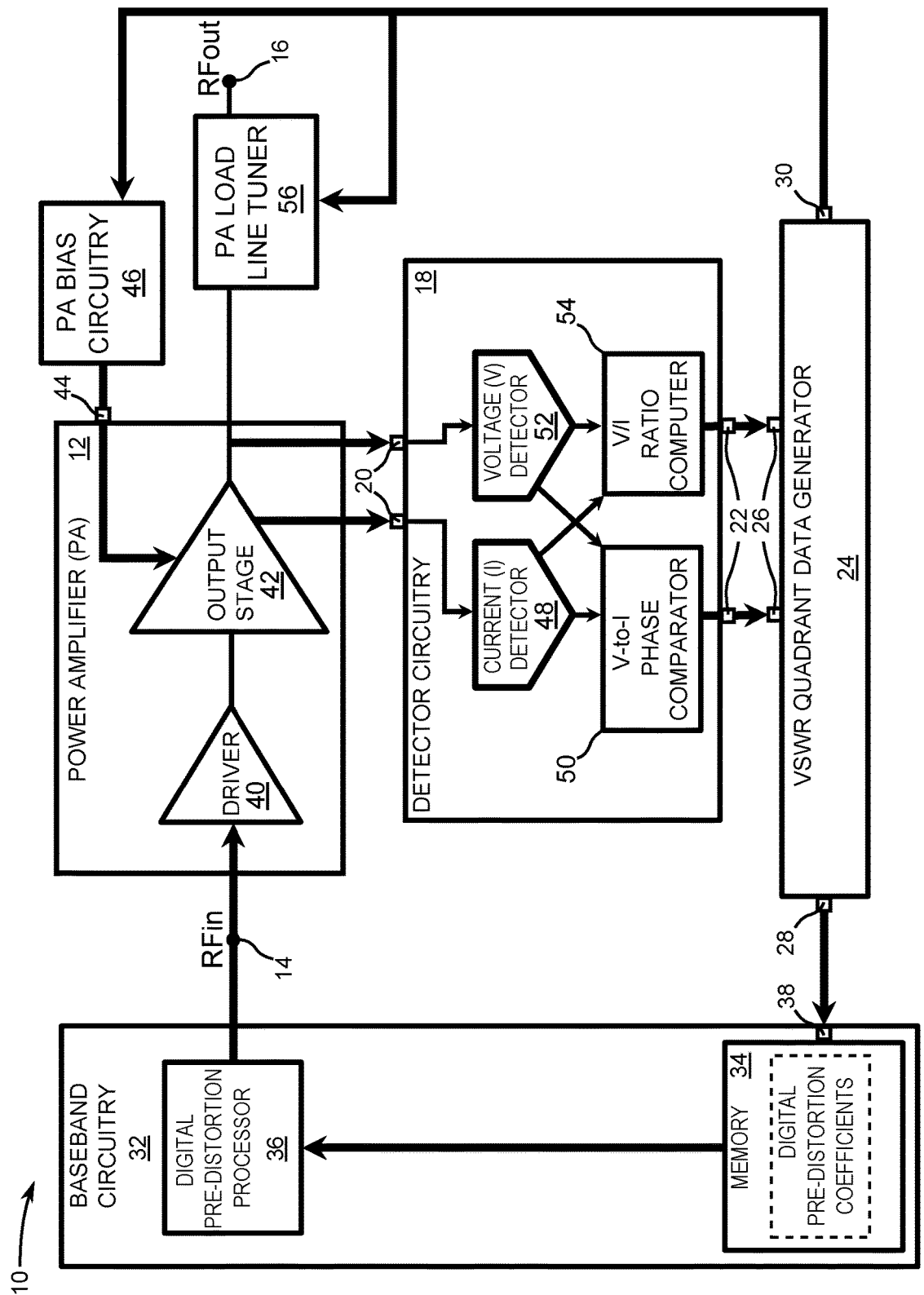
FIG. 2 is a diagram showing an exemplary implementation of coarse quadrant detection for a power amplifier using voltage (V) and current (I) sensors.

In an alternate embodiment depicted in FIG. 2, the coarse VSWR information that includes the detected VSWR quadrant data is usable locally in the front-end to generate an appropriate power amplifier bias or modulate the power amplifier load to provide improved linearity and/or current consumption.

The coarse power amplifier VSWR detector may be used in a continuous mode or in a sampled mode.

Many of today's mobile communications use time division duplex technology. The coarse VSWR detection may be triggered with a predetermined delay by a power amplifier TX-enable signal.

Many TX systems may use dynamic supply modulation such as envelope tracking or dynamic average power tracking. In such cases, the power level and thus the supply voltage is changed continuously, based on symbol or even sub-symbol timing. As such, various ways of triggering the coarse VSWR detector may be implemented.

FIG. 2 shows an exemplary implementation of coarse quadrant VSWR detection for the power amplifier 12 using voltage (V) and current (I) sensors. In this case, the VSWR phase detector 50 is configured as a V-to-I phase comparator, and the VSWR amplitude detector 54 is configured as a V/I ratio computer, which may be an analog computer or digital processor. In response to the coarse quadrant VSWR detection, the V/I ratio determines the VSWR amplitude and the V-to-I phase estimates the VSWR phase. The exemplary embodiment of FIG. 2 also includes a PA load line tuner 56 that is coupled between the output stage 42 and the RF output 16.

Several types of detectors can be used to perform a coarse VSWR detection. The power amplifier may have a local voltage detector and local current detector to make voltage magnitude and voltage phase measurements along with current magnitude and current phase measurements. These measurements may not be available at the baseband level and may need to be made in the front-end that is predominately made up of analog circuitry:

By measuring the phase relation between the voltage and the current, the VSWR phase is estimated.

By computing the ratio between the voltage magnitude and the current magnitude, the VSWR amplitude is estimated.

High accuracy VSWR phase and amplitude detectors can be implemented, but they may result in increased power dissipation, die area, and complexity, without bringing appreciable benefits.

The baseband processor may not practically increase by a large multiplier the memory size allocated to the DPD coefficient sets. This means that in most cases knowing coarsely where the power amplifier load VSWR is, is sufficient for increasing the linearity of the power amplifier.

One good example is knowing the VSWR quadrant. This results in a 4× increase of the DPD memory size, since for each major condition (e.g., operating band, or operating VCC/power level), four different sets of DPD coefficients need to be saved. This is in general acceptable, particularly with scaling down of the CMOS process, which allows the integration of an ever increasing number of semiconductor devices.

Figure 3:
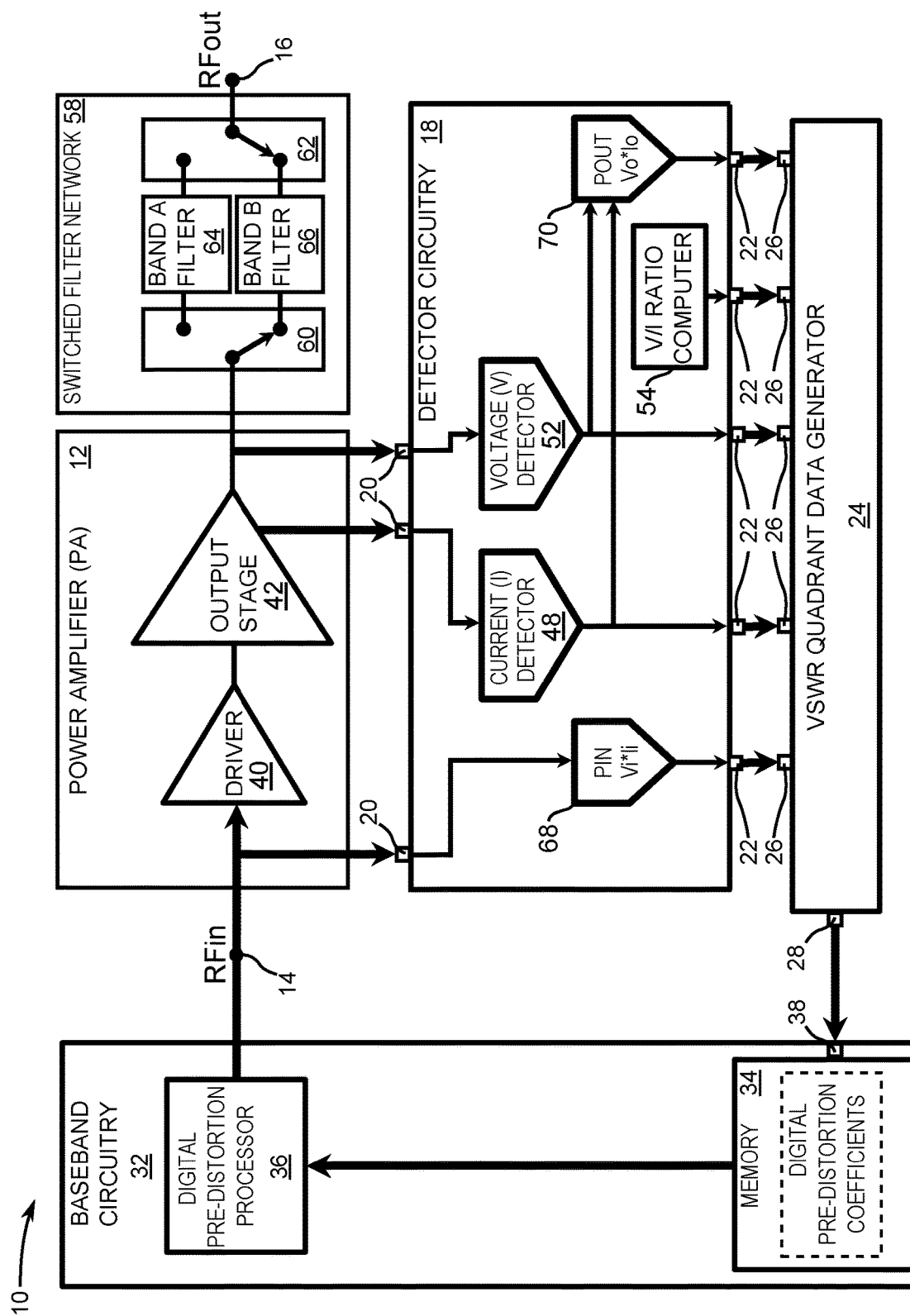
FIG. 3 is a diagram showing an alternate embodiment of a VSWR quadrant detector using additional detectors that are an input power detector and an output power detector.

FIG. 3 shows an alternate exemplary embodiment of power amplifier system 10 that includes a switched filter network 58 made up of a first filter switch 60 coupled to the output stage 42 and a second filter switch 62 coupled to the RF output 16. A band A filter 64 and a band B filter 66 are coupled between the first filter switch 60 and the second filter switch 62. As depicted in FIG. 3, the RF signal amplified by the power amplifier 12 may be selectively routed through either the band A filter 64 or the band B filter 66. Additional band filters may be added without departing from the spirit of the present disclosure. Moreover, the band filters may be any of the types used to filter RF signals. For example, the filters may be of the acoustic resonator type and the inductor and capacitor filter type. The alternate exemplary embodiment of FIG. 3 may be configured to provide additional information to the baseband circuitry 32 using additional detectors: an input power detector 68 and an output power detector 70.

Using a voltage detector and a current detector is just one possible example. The front-end may also have other types of detectors that can assist. In this case the input power detector 68 can be used. Since the power amplifier input VSWR is generally well controlled, the input power detector 68 (Pin) may be implemented by a simple voltage detector. If input VSWR is also varying, a true power detector needs to be used.

The output power detector 70 is in general a little more difficult to implement because the power amplifier output load VSWR varies more. Multiplier-type power detectors can be used, but they take more current and need more complex calibration.

One example of a simplified power amplifier output power detector is to use a power detector based on the first-order Taylor expansion of the power as a function of voltage and current. Such detectors can be implemented both in bipolar processes—for example, silicon germanium (SiGe), gallium arsenide (GaAs), gallium nitride (GaN), indium phosphide (In P), and bipolar CMOS—and field-effect transistor processes, such as bulk CMOS, silicon-on-insulator (SOI)—CMOS, pseudomorphic high electron mobility transistor (pHEMT), junction field-effect transistor (JFET), laterally diffused metal oxide semiconductor (LD-MOS), and bipolar-CMOS-DMOS (BCD).

In general, DPD linearization is needed at moderately high and peak power levels. At lower power levels the power amplifier may be linear enough by itself and the DPD may be disabled. As such, at low power levels, it is a drawback to keep active all these analog detectors that use considerable power. At moderate high and high power levels, the current consumed by the detector is a small portion of the overall power amplifier current consumption, and thus it does not impact the power amplifier efficiency. One example is when the power amplifier takes 500 mA and all the analog detectors may take 10 mA. In such a case a negligible power amplifier efficiency impact happens.

At medium power the power amplifier may take 50 mA to 100 mA. In this case the 10 mA consumed by the analog detectors starts to matter.

At low power levels the power amplifier itself may take only 10 mA to 20 mA. Consuming 10 mA in the analog detectors is relatively highly inefficient. As such, an enable signal is useful to turn on the coarse power amplifier VSWR detection only at moderate-high and high power levels and in particularly when both high power and high VSWR are present.

Figure 4:
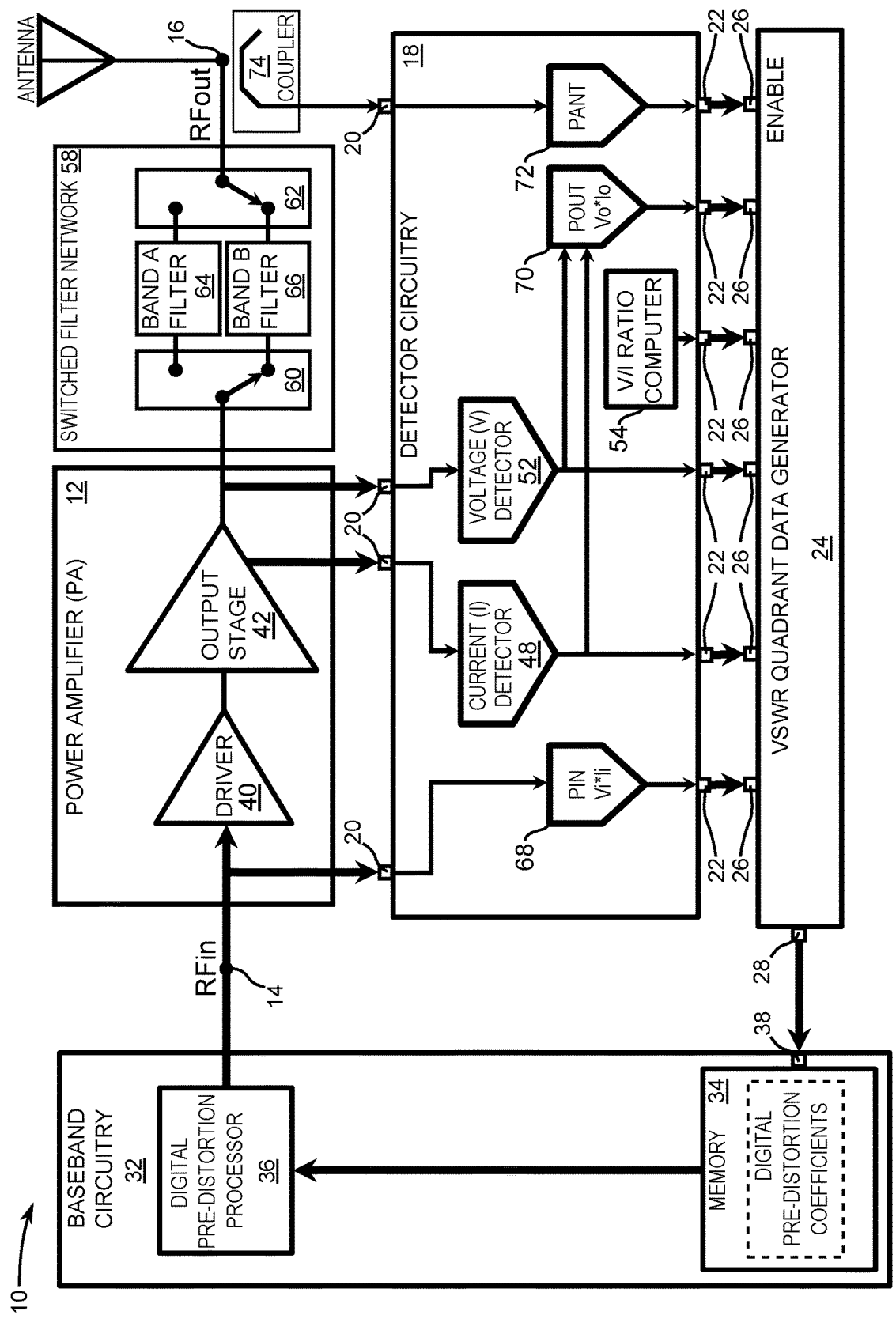
FIG. 4 is a diagram showing yet another embodiment of VSWR quadrant detection using a reverse power detector at the antenna coupler isolation port so as to enable a further enhanced VSWR coarse detector structure and method.

FIG. 4 depicts an exemplary embodiment of the present power amplifier system that is configured for compensating for a case of high power and high VSWR with a large reflected power present. A reflected power detector 72 labeled PANT placed at an isolation port of an antenna coupler 74 is configured to measure such reflected power, and by comparing with a given threshold (or multiple thresholds), an enable signal for the coarse VSWR quadrant data generator 24 is generated, as shown in FIG. 4.

This enablement may work for any type of coarse VSWR detection:
  Coarse VSWR phase detection
  Both coarse phase and amplitude detection
  The resolution of the coarse VSWR detection is dependent on the amount of memory that is available in the baseband. Having only two sub-ranges for VSWR phase and two sub-ranges for VSWR amplitude gives four VSWR regions (quadrants). Such coarse VSWR detection is almost always acceptable.

If the VSWR phase is split into four sub-ranges and the VSWR amplitude is also split into four sub-ranges, 16 VSWR regions are estimated/discriminated. This can lead to a substantial memory increase, for example, as much as a 16 times increase.

If only VSWR phase is coarsely measured, a VSWR phase with four sub-ranges is generally acceptable. Other combinations of VSWR phase and/or VSWR amplitude resolution are possible.

Figure 5:
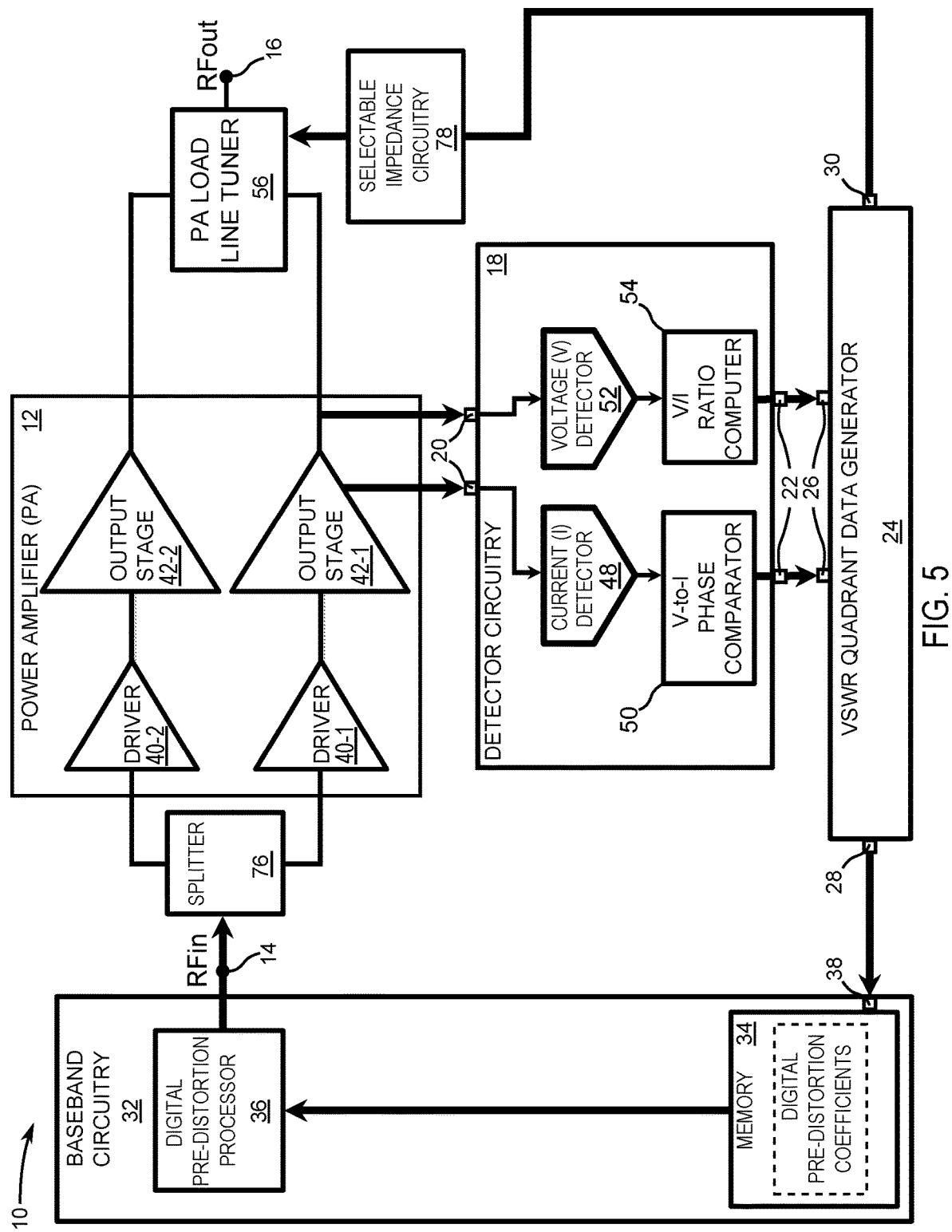
FIG. 5 is a diagram showing an example of a coarse VSWR detector to improve performance of the load modulation of a quadrature-style power amplifier that includes but is not limited to Doherty power amplifiers and other load-modulated power amplifiers.

FIG. 5 shows an exemplary embodiment of the power amplifier system 10 in which the VSWR quadrant data generator 24 is configured to perform coarse VSWR detection to maximize linearity and efficiency of load modulation of a quadrature-style power amplifier such as a quadrature power amplifier, a Doherty power amplifier, or other load-modulated power amplifiers. In the exemplary embodiment of FIG. 5, the power amplifier 12 has a first driver 40-1 that is configured to drive a first output stage 42-1 and a second driver 40-2 that is configured to drive a second output stage 42-2. A splitter 76 coupled between the RF input 14 and the first driver 40-1 and the second driver splits the RF signal in two to provide separate amplification of the RF signal.

A coarse VSWR detection not only can be used to provide analog assist to a baseband DPD linearization but also can be used locally in the front-end to directly increase efficiency of the power amplifier 12. One such example is when the power amplifier uses some type of quadrature configuration with load-modulation capabilities. Examples are quadrature power amplifiers, Doherty power amplifiers, and other types of load-modulated power amplifiers.

Knowledge of power amplifier VSWR quadrant is usable in selecting the power amplifier load modulation. In such cases the coarse VSWR quadrant data can be used to select passive inductances and capacitances that are integrated into selectable impedance circuitry 78 that combines with the PA load line tuner 56 to modulate the load impedance of the power amplifier 12. One such implementation is using an output power amplifier coupler/combiner that can make up the circuit topology of the PA load line tuner 56, wherein the selectable impedance circuitry has inductive and capacitive impedances that are employed in response to VSWR quadrant data. By unbalancing the impedance of the selectable impedance circuitry 78, the linearity characteristics of the power amplifier 12 can be improved. The selectable impedance circuitry 78 may be realized with an RF coupler.

Figure 6:
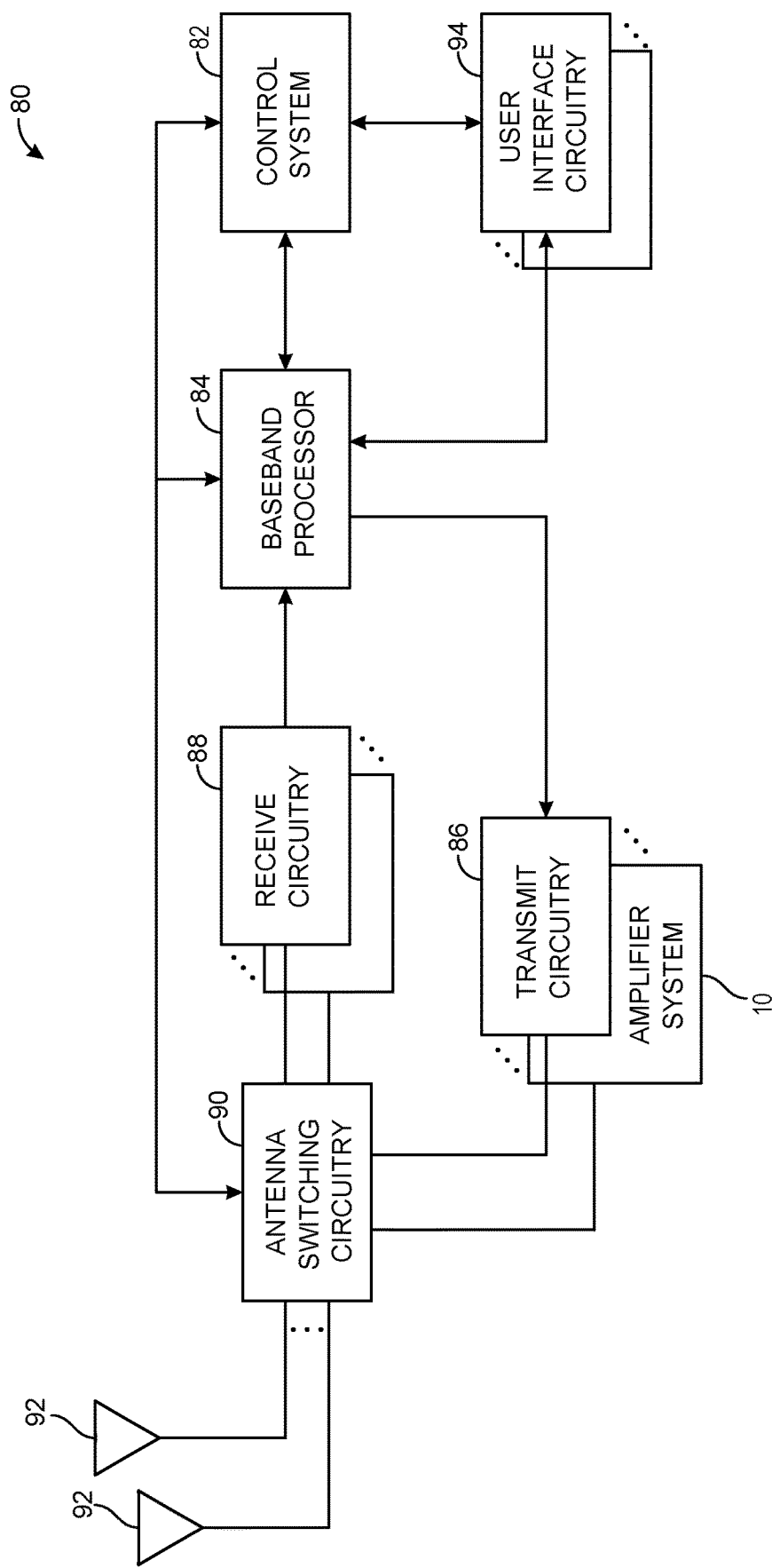
FIG. 6 is a diagram showing how the disclosed power amplifier system may interact with user elements such as wireless communication devices.

With reference to FIG. 6, the concepts described above may be implemented in various types of wireless communication devices or user elements 80, such as mobile terminals, smart watches, tablets, computers, navigation devices, access points, and the like that support wireless communications, such as cellular, wireless local area network (WLAN), Bluetooth, and near-field communications. The user elements 80 will generally include a control system 82, a baseband processor 84, transmit circuitry 86 that includes the power amplifier system 10, receive circuitry 88, antenna switching circuitry 90, multiple antennas 92, and user interface circuitry 94. The receive circuitry 88 receives radio frequency signals via the antennas 92 and through the antenna switching circuitry 90 from one or more basestations. A low-noise amplifier and a filter (not shown) cooperate to amplify and remove broadband interference from the received signal for processing. Downconversion and digitization circuitry (not shown) then downconvert the filtered, received signal to an intermediate or baseband frequency signal, which is then digitized into one or more digital streams.

The baseband processor 84 processes the digitized received signal to extract the information or data bits conveyed in the received signal. This processing typically comprises demodulation, decoding, and error correction operations. The baseband processor 84 is generally implemented in one or more digital signal processors (DSPs) and application-specific integrated circuits (ASICs).

For transmission, the baseband processor 84 receives digitized data, which may represent voice, data, or control information, from the control system 82, which it encodes for transmission. The encoded data are output to the transmit circuitry 86, where they are used by a modulator (not shown) to modulate a carrier signal that is at a desired transmit frequency or frequencies. A power amplifier (not shown) amplifies the modulated carrier signal to a level appropriate for transmission and delivers the modulated carrier signal to the antennas 92 through the antenna switching circuitry 90. The antennas 92 and the replicated transmit circuitry 86 and receive circuitry 88 may provide spatial diversity. Modulation and processing details will be understood by those skilled in the art.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A power amplifier system comprising:
   a power amplifier having an amplification path between a radio frequency (RF) input and an RF output;
   detector circuitry having detector inputs coupled to sample locations within the amplification path, wherein the detector circuitry is configured to detect signal characteristics of the RF signal at the sample locations and provide the detected signal characteristics at detector outputs; and
   a voltage standing wave ratio (VSWR) quadrant data generator in communication with the detector outputs, wherein the VSWR quadrant data generator is configured to generate VSWR quadrant data in response to the detected signal characteristics and provide the determined VSWR quadrant data at a data output; and
   baseband circuitry comprising;
      a memory configured with digital pre-distortion (DPD) coefficients; and
      a DPD processor having a first data input coupled to the VSWR quadrant data generator's data output, wherein the DPD processor is configured, in response to the generated VSWR quadrant data, to selectively retrieve DPD coefficients and employ the same to control shaping of the pre-distortion applied to the RF signal for increased linearity.

2. The power amplifier system of claim 1 wherein the VSWR quadrant data comprises VSWR phase angle and/or VSWR amplitude.

3. The power amplifier system of claim 2 further comprising power amplifier bias circuitry coupled between a VSWR quadrant data output of the VSWR quadrant data generator and a bias input of the power amplifier, wherein the power amplifier bias circuitry is configured to respond to the VSWR quadrant data and adjust the bias of the power amplifier to improve linearity of an RF signal being amplified by the power amplifier.

4. The power amplifier system of claim 1 wherein the detector circuitry comprises:
a current detector coupled to an output of the power amplifier;
a voltage detector coupled to the output of the power amplifier; and
a voltage-to-current phase comparator configured to determine a VWSR phase from current detected by the current detector and voltage detected by the voltage detector and wherein the VSWR phase is converted to VSWR quadrant data by the VSWR quadrant data generator.

5. The power amplifier system of claim 4 further comprising a voltage-to-current ratio computer configured to determine VSWR amplitude that is converted by the VSWR quadrant data generator into additional VSWR quadrant data.

6. The power amplifier system of claim 5 wherein the detector circuitry further comprises an output power detector configured to detect output power by way of current detected by the current detector and voltage detected by the voltage detector, wherein the output power detected is converted to additional VSWR quadrant data generated by the VSWR quadrant data generator.

7. The power amplifier system of claim 4 wherein the detector circuitry further comprises an input power detector coupled to the RF input, wherein the input power detected is converted to additional VSWR quadrant data generated by the VSWR quadrant data generator.

8. The power amplifier system of claim 1 further comprising a switched filter network coupled between the power amplifier and the RF output.

9. The power amplifier system of claim 1 wherein the power amplifier comprises an output stage and a driver configured to drive the output stage.

10. The power amplifier system of claim 1 wherein the power amplifier is configured as a quadrature-type amplifier.

11. The power amplifier system of claim 1 further comprising a power amplifier load tuner coupled between the power amplifier and the RF output, wherein the power amplifier load tuner is configured to respond to the VSWR quadrant data generated by the VSWR quadrant data generator by modulating load impedance of the amplifier to improve linearity of an RF signal amplified by the power amplifier.

12. The power amplifier system of claim 11 further comprising additional selectable impedance circuitry that is coupled between the power amplifier load tuner and an output of the VSWR quadrant data generator, wherein the selectable impedance circuitry has inductive and capacitive impedances that are employed in response to VSWR quadrant data.

13. A method of amplifying power in a power amplifier system, the method comprising:
amplifying a radio frequency (RF) signal along an amplification path of a power amplifier;
detecting signal characteristics of the RF signal at sample locations within the amplification path using detector circuitry;
generating voltage standing wave ratio (VSWR) quadrant data in response to the detected signal characteristics using a VSWR quadrant data generator;
updating digital pre-distortion (DPD) coefficients in a memory of baseband circuitry; and
selectively retrieving DPD coefficients in response to the generated VSWR quadrant data, and controlling shaping of the pre-distortion applied to the RF signal for increased linearity using a DPD processor.

14. The method of claim 13, wherein the VSWR quadrant data includes VSWR phase angle and/or VSWR amplitude.

15. The method of claim 14, further comprising adjusting the bias of the power amplifier to improve linearity of an RF signal being amplified by the power amplifier, in response to the VSWR quadrant data.

16. The method of claim 13, further comprising:
detecting a current at an output of the power amplifier;
detecting a voltage at the output of the power amplifier; and
determining a VWSR phase from the detected current and voltage, and converting the VSWR phase to VSWR quadrant data.

17. The method of claim 16, further comprising determining a VSWR amplitude that is converted into additional VSWR quadrant data.

18. The method of claim 17, further comprising detecting output power by way of the detected current and voltage, and converting the detected output power to additional VSWR quadrant data.

19. The method of claim 16, further comprising detecting input power at the RF input, and converting the detected input power to additional VSWR quadrant data.

20. The method of claim 13, further comprising passing the amplified RF signal through a switched filter network before output.

21. The method of claim 13, wherein the power amplifier includes an output stage, and the method further comprises driving the output stage of the power amplifier.

22. The method of claim 13, wherein the power amplifier operates as a quadrature type amplifier.

23. The method of claim 13, further comprising modulating load impedance of the amplifier in response to the VSWR quadrant data to improve linearity of an RF signal amplified by the power amplifier.

24. The method of claim 23, further comprising employing inductive and capacitive impedances in response to VSWR quadrant data, using additional selectable impedance circuitry coupled between a power amplifier load tuner and an output of the VSWR quadrant data generator.

25. A wireless communication device comprising:
a baseband processor;
transmit circuitry configured to receive encoded data from the baseband processor and to modulate a carrier signal with the encoded data, wherein the transmit circuitry comprises:
a power amplifier having an amplification path between a radio frequency (RF) input and an RF output;
detector circuitry having detector inputs coupled to sample locations within the amplification path, wherein the detector circuitry is configured to detect signal characteristics of the RF signal at the sample locations and provide the detected signal characteristics at detector outputs; and
a voltage standing wave ratio (VSWR) quadrant data generator in communication with the detector outputs, wherein the VSWR quadrant data generator is configured to generate VSWR quadrant data in response to the detected signal characteristics and to provide the determined VSWR quadrant data at a data output; and baseband circuitry comprising;
  a memory configured with digital pre-distortion (DPD) coefficients; and
  a DPD processor having a first data input coupled to the VSWR quadrant data generator's data output, wherein the DPD processor is configured, in response to the generated VSWR quadrant data, to selectively retrieve DPD coefficients and employ the same to control shaping of the pre-distortion applied to the RF signal for increased linearity.

26. The wireless communication device of claim 25 wherein the VSWR quadrant data comprise VSWR phase angle and/or VSWR amplitude.

27. The wireless communication device of claim 26 further comprising power amplifier bias circuitry coupled between a VSWR quadrant data output of the VSWR quadrant data generator and a bias input of the power amplifier, wherein the power amplifier bias circuitry is configured to respond to the VSWR quadrant data and adjust the bias of the power amplifier to improve linearity of an RF signal being amplified by the power amplifier.

28. The wireless communication device of claim 25 wherein the detector circuitry comprises:
  a current detector coupled to an output of the power amplifier;
  a voltage detector coupled to the output of the power amplifier; and
  a voltage-to-current phase comparator configured to determine a VWSR phase from current detected by the current detector and voltage detected by the voltage detector and wherein the VSWR phase is converted to VSWR quadrant data by the VSWR quadrant data generator.

29. The wireless communication device of claim 28 further comprising a voltage-to-current ratio computer configured to determine VSWR amplitude that is converted by the VSWR quadrant data generator into additional VSWR quadrant data.

30. The wireless communication device of claim 29 wherein the detector circuitry further comprises an output power detector configured to detect output power by way of current detected by the current detector and voltage detected by the voltage detector, wherein the output power detected is converted to additional VSWR quadrant data generated by the VSWR quadrant data generator.

31. The wireless communication device of claim 28 wherein the detector circuitry further comprises an input power detector coupled to the RF input, wherein the input power detected is converted to additional VSWR quadrant data generated by the VSWR quadrant data generator.

32. The wireless communication device of claim 25 further comprising a switched filter network coupled between the power amplifier and the RF output.

33. The wireless communication device of claim 25 wherein the power amplifier comprises an output stage and a driver configured to drive the output stage.

34. The wireless communication device of claim 25 wherein the power amplifier is configured as a quadrature-type amplifier.

35. The wireless communication device of claim 25 further comprising a power amplifier load tuner coupled between the power amplifier and the RF output, wherein the power amplifier load tuner is configured to respond to the VSWR quadrant data generated by the VSWR quadrant data generator by modulating load impedance of the amplifier to improve linearity of an RF signal amplified by the power amplifier.

36. The wireless communication device of claim 35 further comprising additional selectable impedance circuitry that is coupled between the power amplifier load tuner and an output of the VSWR quadrant data generator, wherein the selectable impedance circuitry has inductive and capacitive impedances that are employed in response to VSWR quadrant data.

* * * * *